(12) United States Patent
Inoue

(10) Patent No.: US 9,007,137 B2
(45) Date of Patent: Apr. 14, 2015

(54) OSCILLATION CIRCUIT AND OPERATING CURRENT CONTROL METHOD THEREOF

(75) Inventor: Fumihiro Inoue, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 28 days.

(21) Appl. No.: 13/704,367

(22) PCT Filed: May 10, 2011

(86) PCT No.: PCT/JP2011/060750
§ 371 (c)(1),
(2), (4) Date: Dec. 14, 2012

(87) PCT Pub. No.: WO2011/158576
PCT Pub. Date: Dec. 22, 2011

(65) Prior Publication Data
US 2013/0082789 A1 Apr. 4, 2013

(30) Foreign Application Priority Data
Jun. 17, 2010 (JP) ................................ 2010-138231

(51) Int. Cl.
*H03K 3/0231* (2006.01)
*H03K 3/011* (2006.01)
*H03K 3/36* (2006.01)

(52) U.S. Cl.
CPC .................. *H03K 3/36* (2013.01); *H03K 3/011* (2013.01); *H03K 3/0231* (2013.01)

(58) Field of Classification Search
CPC ..... H03K 3/0231; H03K 3/354; H03K 3/011; H03K 3/023; H03K 3/03; H03K 3/353; H03K 4/12; H03K 4/24; H03K 4/50; H03K 4/501; H03K 4/502; H03K 5/22; H03K 5/24

USPC ............................ 327/182; 331/111, 143, 153
See application file for complete search history.

(56) References Cited

U.S. PATENT DOCUMENTS

| 4,623,851 A | * | 11/1986 | Abou ............................. 331/111 |
| 4,623,852 A | | 11/1986 | Abou et al. |
| 4,963,840 A | * | 10/1990 | Thommen ..................... 331/111 |
| 6,456,170 B1 | * | 9/2002 | Segawa et al. ................ 331/143 |
| 6,914,494 B1 | * | 7/2005 | Chen ............................. 331/111 |

(Continued)

FOREIGN PATENT DOCUMENTS

| JP | 61-107810 | 5/1986 |
| JP | 2001-160739 | 6/2001 |

(Continued)

OTHER PUBLICATIONS

International Search Report mailed on Jun. 14, 2011.

*Primary Examiner* — Levi Gannon
(74) *Attorney, Agent, or Firm* — IPUSA, PLLC

(57) ABSTRACT

An oscillation circuit includes a condenser, a charging/discharging part configured to switch between charging and discharging of the condenser according to a control signal, a comparator configured to compare a voltage of the condenser with a reference voltage and output a comparison result signal, a flip-flop configured to be set or reset according to the comparison result signal, supply an output signal as the control signal to the charging/discharging part, and output the output signal as an oscillation signal, and a current control part configured to control an operating current of the comparator in correspondence with the voltage of the condenser.

8 Claims, 9 Drawing Sheets

(56) References Cited

U.S. PATENT DOCUMENTS

| | | | |
|---|---|---|---|
| 6,954,112 B2* | 10/2005 | Vecera et al. | 331/143 |
| 7,102,452 B1* | 9/2006 | Holmes | 331/111 |
| 7,486,151 B2* | 2/2009 | Goudo | 331/143 |
| 7,508,729 B2* | 3/2009 | Takeuchi | 365/222 |
| 7,884,679 B2* | 2/2011 | Mahooti | 331/143 |
| 2009/0072918 A1* | 3/2009 | Chung | 331/113 R |
| 2013/0021109 A1* | 1/2013 | Niederl | 331/111 |

FOREIGN PATENT DOCUMENTS

| | | |
|---|---|---|
| JP | 2004-349831 | 12/2004 |
| JP | 2009-159344 | 7/2009 |

* cited by examiner

US 9,007,137 B2

OSCILLATION CIRCUIT AND OPERATING CURRENT CONTROL METHOD THEREOF

TECHNICAL FIELD

The present invention relates to an oscillation circuit and an operating current control method thereof.

BACKGROUND ART

FIG. 9 is a circuit configuration diagram illustrating an example of an oscillation circuit according to a related art example. In FIG. 9, a constant current source 1 has one end connected to a power supply Vdd and another end connected to the sources of p channel MOS transistors M1, M3. A drain of the MOS transistor M1 is connected to a drain of an n channel MOS transistor M2. A source of the MOS transistor M2 is connected to a power supply Vss. A drain of the MOS transistor M3 is connected to a drain of an n channel MOS transistor M4. A source of the MOS transistor M4 is connected to the power supply Vss.

The drains of the MOS transistors M1, M2 are connected to one end of a condenser C1 and also connected to a non-inverting input terminal of a comparator 2. The other end of the condenser C1 is connected to the power supply Vss. The gates of the MOS transistors M1, M2 are connected to a Q terminal of an RS flip-flop 4.

Further, the drains of the MOS transistors M3, M4 are connected to one end of a condenser C2 and also connected to a non-inverting input terminal of a comparator 3. The other end of the condenser C2 is connected to the power supply Vss. The gates of the MOS transistors M3, M4 are connected to a QB terminal of the RS flip-flop 4.

The inverting input terminals of the comparators 2, 3 are connected to one end of a constant voltage source 5 and have a reference voltage Vth applied thereto. The other end of the constant voltage source 5 is connected to the power supply Vss. The comparator 2 has a current input terminal being connected to one end of a constant current source 6 and being supplied with an operating current. The other end of the constant current source 6 is connected to the power supply Vss. The comparator 2 generates an output signal of a high level when a voltage of the condenser C1 exceeds the reference voltage Vth and generates an output signal of a low level when the voltage of the condenser C1 is less than or equal to the reference voltage Vth, and supplies the output signal to a setting terminal S of the flip-flop 4.

The comparator 3 has a current input terminal connected to one end of a constant current source 7 and has an operating current supplied thereto. The other end of the constant current source 7 is connected to the power supply Vss.

The comparator 3 generates an output signal of a high level when a voltage of the condenser C2 exceeds the reference voltage Vth and generates an output signal of a low level when the voltage of the condenser C2 is less than or equal to the reference voltage Vth, and supplies the output signal to a resetting terminal R of the flip-flop 4.

A Q terminal output of the flip-flop 4 becomes a high level and a QB terminal output of the flip-flop 4 becomes a low level when a high level signal is supplied to the setting terminal S. Further, the Q terminal output of the flip-flop 4 becomes a low level and the QB terminal output of the flip-flop 4 becomes a high level when a high level signal is supplied to the resetting terminal R.

<Operation>

In a case where the Q terminal output of the flip-flop 4 is a low level (FIG. 10(E)) while at the same time, the QB terminal output of the flip-flop 4 is a high level (FIG. 10(F)), the MOS transistor M1 is on, the MOS transistor M2 is off, the condenser C1 is charged (FIG. 10(A)), the MOS transistor M3 is off, the MOS transistor M4 is on, and the condenser C2 is discharged (FIG. 10(C)). Further, in a case where the voltage of the condenser C1 exceeds the reference voltage Vth, the output of the comparator 2 becomes a high level (FIG. 10(B)), the flip-flop 4 is set, so that the Q terminal output becomes a high level, and the QB terminal output becomes a low level.

In this case, the MOS transistor M1 is off, the MOS transistor M2 is on, and the condenser C1 is discharged while at the same time, the QB terminal output is a low level, the MOS transistor M3 is on, the MOS transistor M4 is off, and the condenser C2 is charged. Further, in a case where the voltage of the condenser C2 exceeds the reference voltage Vth, the output of the comparator 3 becomes a high level (FIG. 10(D)), the flip-flop 4 is reset, so that the Q terminal output becomes a low level, and the QB terminal output becomes a high level.

There is a known art constituting an oscillation circuit that uses: an amplifier that generates a charge/discharge current of a condenser in accordance with high/low of first and second input signals; two comparators that compares the lower limit voltages; a flip-flop that resets/sets according to output signals from each of the two comparators; a switch that supplies driving currents to one of the two comparators in accordance with a control signal (see, for example, Patent Document 1).

In order for the oscillation circuit of the related art example illustrated in FIG. 9 to steadily output an oscillation signal of a predetermined frequency, it is necessary to supply a sufficient amount of driving current from the constant current sources 6, 7 to the comparators 2, 3. Particularly, in a case where the oscillation frequency is large, the driving current to be supplied to the comparators 2, 3 increases. Therefore, the oscillation circuit of the related art consumes a large amount of electric power.

In a case where the oscillation frequency is set having a large value, the comparators 2, 3 cannot sufficiently react. Thereby, a prohibited state occurs in which the setting terminal S and the resetting terminal RS of the flip-flop 4 become a high level at the same time. Thus, there is a possibility causing oscillation to stop.

Patent Document 1: Japanese Laid-Open Patent Publication No. 2009-159344

DISCLOSURE OF THE INVENTION

Problem to be Solved by Invention

In view of the above-described problems, the present invention aims to provide an oscillation circuit that reduces consumption power and a method for controlling the operating current thereof.

Means for Solving Problem

According to an embodiment of the present invention, there is provided an oscillation circuit including a condenser, a charging/discharging part configured to switch between charging and discharging of the condenser according to a control signal, a comparator configured to compare a voltage of the condenser with a reference voltage and output a comparison result signal, a flip-flop configured to be set or reset according to the comparison result signal, supply an output signal as the control signal to the charging/discharging part, and output the output signal as an oscillation signal, and a current control part configured to control an operating current of the comparator in correspondence with the voltage of the condenser.

Effect of Invention

For example, with an embodiment of the present invention, power consumption can be reduced.

Figure 1:
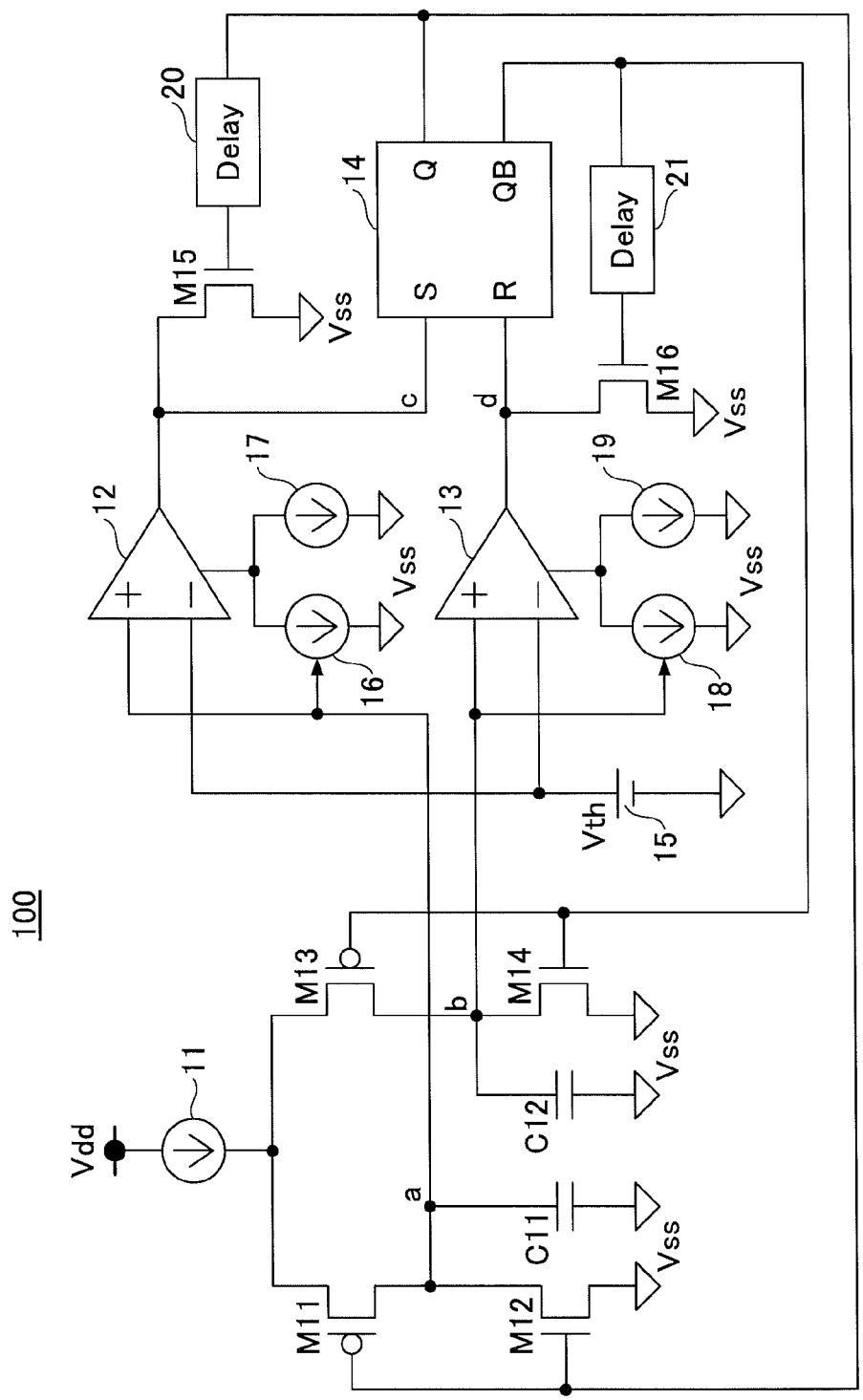
FIG. 1 is a circuit configuration diagram of an oscillation circuit according to a first embodiment of the present invention.

EXPLANATION OF REFERENCE NUMERALS 12, 13 comparator
14 flip-flop
15 constant voltage circuit
16-19 current source
20, 21 delay circuit
C11, C12 condenser
M11-M16 MOS transistor

BEST MODE FOR CARRYING OUT THE INVENTION

In the following, preferred embodiments of the present invention are described with reference to the accompanying drawings.

First Embodiment

<Circuit Configuration Diagram of Oscillation Circuit Of First Embodiment>

FIG. 1 is a circuit configuration diagram of an oscillation circuit 100 according to the first embodiment of the present invention. In FIG. 1, a constant current source 11 has one end connected to a power supply Vdd and another end connected to the sources of p-channel MOS transistors M11, M13. A drain of the MOS transistor M11 is connected to a drain of an n-channel MOS transistor. A source of the MOS transistor M12 is connected to a power supply Vss. Further, a drain of the MOS transistor M13 is connected to a drain of an n-channel MOS transistor M14. A source of the MOS transistor M14 is connected to the power supply Vss.

The drains of the MOS transistors M11, M12 are connected to one end of a condenser C11 and also connected to a non-inverting input terminal of a comparator 12 and a control terminal of a current source 16. The other end of the condenser C11 is connected to the power supply Vss. The gates of the MOS transistors M11, M12 are connected to a Q terminal of an RS flip-flop 14. Further, the drains of the MOS transistors M13, M14 are connected to one end of a condenser C12 and also connected to a non-inverting input terminal of the comparator 13 and a control terminal of a current source 18. The other end of the condenser C12 is connected to the power supply Vss. The gates of the MOS transistors M13, M14 are connected to a QB terminal of the RS flip-flop 14.

The inverting input terminals of the comparators 12, 13 are connected to one end of a constant voltage circuit 15 and have a reference voltage Vth applied thereto. The other end of the constant voltage circuit 15 is connected to the power supply Vss. The comparator 12 has a current input terminal connected to the current source 16, one end of the current source 16, and one end of a current source 17 and has an operating current supplied thereto. The other end of the current source 16 and the other end of the current source 17 are connected to the power supply Vss. The current source 16 has a voltage of the condenser C11 supplied thereto. This voltage, when in the vicinity of the reference voltage Vth, causes an operating voltage to flow to the comparator 12 in correspondence with the voltage of the condenser C11.

The current source 17 allows a certain amount of operating current to constantly flow to the comparator 12. Here, an operating current I2, which flows from the current source 17 to the comparator 12, has a small value enough to allow the comparator 12 to maintain its internal state. The maximum amount of operating current I1, which flows from the current source 16 (when voltage is Vth) to the current source 17 and the comparator 12, has a substantially large value enough to allow the comparator 12 to change its internal state.

The comparator 12 generates an output signal that becomes a high level when the voltage of the condenser C11 exceeds the reference voltage Vth and becomes a low level when the voltage of the condenser C11 is less than or equal to the reference voltage Vth, and supplies the output signal to a setting terminal S of the flip-flop 14.

The comparator 13 has a current input terminal connected to one end of a current source 18 and one end of a current source 19 and has an operating current supplied thereto. The other end of the current source 18 and the other end of the current source 19 are connected to the power supply Vss. The current source 18 has a control terminal to which a voltage of the condenser C12 is supplied. This voltage, when in the vicinity of the reference voltage Vth, causes an operating voltage to flow to the comparator 13 in correspondence with the voltage of the condenser C12.

The current source 19 allows a certain amount of operating current to constantly flow to the comparator 13. Here, an operating current I2, which flows from the current source 19 to the comparator 13, has a small value enough to allow the comparator 13 to maintain its internal state. The maximum amount of operating current I1, which flows from the current source 18 (when voltage is Vth) to the current source 19 and the comparator 13, has a substantially large value enough to allow the comparator 13 to change its internal state.

The comparator 13 generates an output signal that becomes a high level when the voltage of the condenser C12 exceeds the reference voltage Vth and becomes a low level when the voltage of the condenser C12 is less than or equal to the reference voltage Vth, and supplies the output signal to a resetting terminal R of the flip-flop 14.

In a case where a high level signal is supplied to the setting terminal S, the output of the Q terminal of the flip-flop 14 becomes a high level, and the output of the QB terminal of the flip-flop 14 becomes a low level. Further, in a case where a high level signal is supplied to the resetting terminal R, the output of the Q terminal of the flip-flop 14 becomes a low level, and the output of the QB terminal of the flip-flop 14 becomes a high level. One of or both of the outputs of the Q terminal or the QB terminal of the flip-flop 14 are output as an oscillation signal(s).

Further, the Q terminal of the flip-flop 14 is connected to a gate of an n-channel MOS transistor M15 via a delay circuit 20. A drain of the MOS transistor M15 is connected to the setting terminal S of the flip-flop 14. A source of the MOS transistor M15 is connected to the power supply Vss. Therefore, in a case where a delay time of the delay circuit 20 elapses after the output of the Q terminal of the flip-flop 14 becomes a high level, the MOS transistor M15 is turned ON, and the setting terminal S of the flip-flop 14 is forced to change to a low level.

Likewise, the QB terminal of the flip-flop 14 is connected to a gate of an n-channel MOS transistor M16 via a delay circuit 21. A drain of the MOS transistor M16 is connected to the resetting terminal R of the flip-flop 14. A source of the MOS transistor M16 is connected to the power supply Vss. Therefore, in a case where a delay time of the delay circuit 21 elapses after the output of the QB terminal of the flip-flop 14 becomes a high level, the MOS transistor M16 is turned ON, and the resetting terminal R of the flip-flop 14 is forced to change to a low level.

Accordingly, by providing the delay circuits 20, 21, and the MOS transistors M15, M16, the setting terminal S and the resetting terminal R of the flip-flop 14 can be prevented from becoming a high level at the same time even in a case where a high value is set to the oscillation frequency.

Figure 2A:
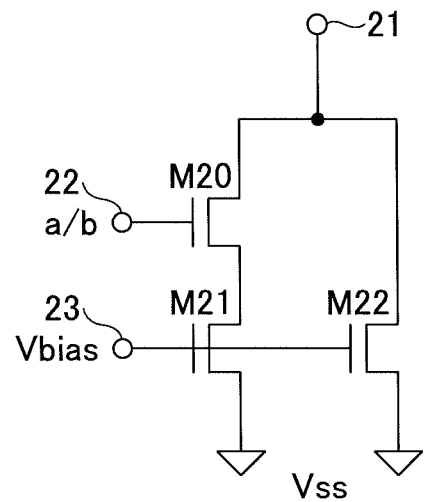
FIG. 2A is a circuit diagram of an embodiment of a current source 16.
Figure 2B:
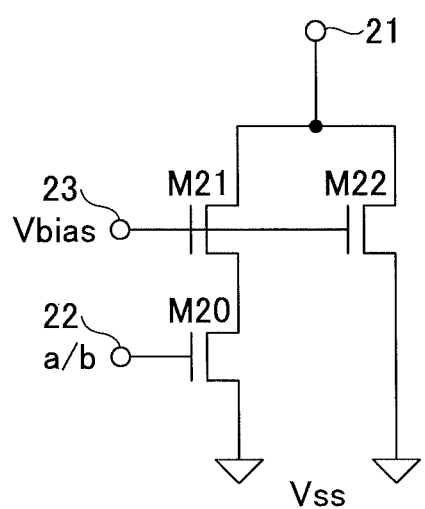
FIG. 2B is a circuit diagram of another embodiment of the current source 16.

FIGS. 2A and 2B are circuit diagram of an embodiment of the current source 16 (17). In FIG. 2A, a terminal 21 is connected to the current input terminal of the comparator 12. The drains of n-channel MOS transistors M20, M22 are connected to the terminal 21. A source of the MOS transistor M20 is connected to a drain of an n-channel MOS transistor M21. The sources of the MOS transistors M21, M22 are connected to the power supply Vss. In the circuit 16, a gate of the MOS transistor M20 is connected to the drains of the MOS transistors M11, M12 via a control terminal 22. A bias voltage Vbias is supplied from a terminal 23 to the gates of the MOS transistors M21, M22. The MOS transistors M20 allows a current to flow in correspondence with the voltage applied to its gate. It is to be noted that a configuration of the circuit 17 is substantially the same as the configuration of the circuit 16 of FIGS. 2A and 2B. The configuration of the circuit 17 is not illustrated due to being substantially the same as the configuration of the circuit 16 illustrated in FIGS. 2A and 2B. However, the circuit 17 has a certain amount of voltage applied from the control terminal 22.

Meanwhile, in another embodiment illustrated in FIG. 2B, the MOS transistor M20 is connected between the MOS transistor M21 and the power supply Vss instead of being connected between the terminal 21 and the MOS transistor M21. Alternatively, the MOS transistor M21 may be omitted from the configuration of FIGS. 2A and 2B.

Although the current sources 16, 17 are constituted by n-channel MOS transistors in FIGS. 2A and 2B, it may be constituted by p-channel MOS transistors. Further, the current sources 18, 19 may also have substantially the same configuration as those of the current sources 16, 17.

Meanwhile, the threshold voltage of the re-channel MOS transistor M20 is, for example, approximately 0.6 V. A value that is greater than or equal to the threshold voltage of the MOS transistor M20 (e.g., approximately 1.0 V) is set to the reference voltage Vth, so that the MOS transistor M20 can perform a desired switching operation. Further, in a case where the oscillation signal generated in the oscillation circuit 100 is to be used as a clock of a continuous-time delta/sigma modulator, the jitter of the clock is desired to be low. In this case, a low jitter is attained by setting the reference voltage Vth high and increasing the SN ratio. On the other hand, in a case where the oscillation circuit 100 is to be used for the purpose of low consumption current, the reference voltage Vth is set to be as low as possible, so that the consumption current can be reduced.

<Operation>

Figure 3:
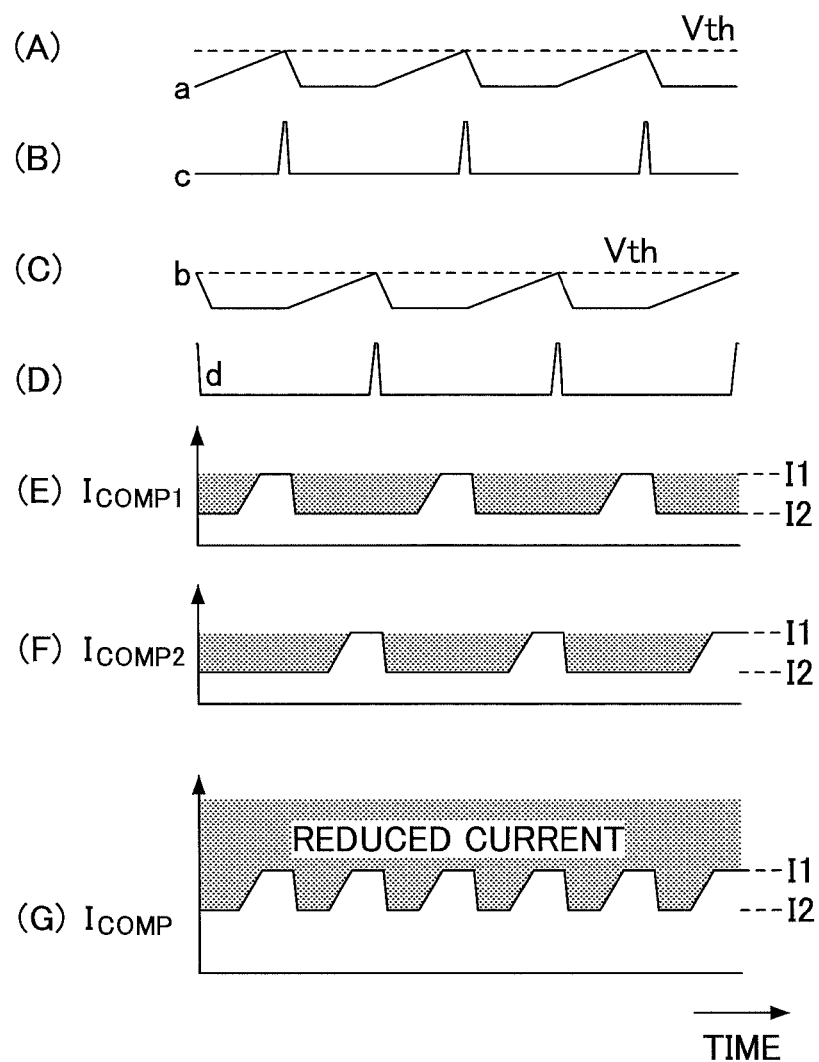
FIG. 3 is a signal waveform diagram of each part of the circuit of FIG. 1.

In a case where the output of the Q terminal of the flip-flop 14 is a low level, the condenser C11 is charged by turning on the MOS transistor M11 and turning off the MOS transistor M12 ((A) of FIG. 3), while at the same time, the condenser C12 is discharged by turning off the MOS transistor M13 and turning on the MOS transistor M14 where the output of the QB terminal is a high level ((C) of FIG. 3). Then, when the voltage of the condenser C11 exceeds the reference voltage Vth, the output of the comparator 12 becomes a high level ((B) of FIG. 3). Thereby, the flip-flop 14 is set, so that the output of the Q terminal becomes a high level and the output of the QB terminal becomes a low level.

In this case, the condenser C11 is discharged by turning off the MOS transistor M11 and turning on the MOS transistor M12, while at the same time, the condenser C12 is charged by turning on the MOS transistor M13 and turning off the MOS transistor M14 where the output of the QB terminal is a low level. Then, when the voltage of the condenser C12 exceeds the reference voltage Vth, the output of the comparator 13 becomes a high level ((D) of FIG. 3). Thereby, the flip-flop 4 is reset, so that the output of the Q terminal becomes a low level and the output of the QB terminal becomes a high level.

The operating current of the comparator 12 is illustrated in (E) of FIG. 3. The current source 17 constantly supplies a current having a value I2, and the current source 16 supplies a serrated current having a maximum value I1 obtained by adding the voltage of the condenser C11 to the current I2 at the vicinity of the reference voltage Vth. Although the comparator 12 requires a large current I1 when the output value switches between a low level and a high level, its inner state can be maintained as long as a small current I2 is supplied thereto when there is no switching.

Conventionally, a current having a value of I1 constantly flows to the comparator 2 whereas the above-described embodiment can reduce the amount of current corresponding to the part illustrated with a satin-like finish in (E) of FIG. 3. Although the amount in which current can be reduced increases or decreases depending on the value of the current I2 and the period in which the current I1 flows, it can be reduced to less than ½ of that of the conventional art.

Similarly, the operating current of the comparator 13 is illustrated in (F) of FIG. 3. The current source 19 constantly supplies a current having a value I2, and the current source 18 supplies a serrated current having a maximum value I1 obtained by adding the voltage of the condenser C12 to the current I2 at the vicinity of the reference voltage Vth. Although the comparator 13 requires a large current I1 when the output value switches between a low level and a high level, its inner state can be maintained as long as a small current I2 is supplied thereto when there is no switching.

Conventionally, a current having a value of I1 constantly flows to the comparator 3 whereas the above-described embodiment can reduce the amount of current corresponding to the part illustrated with a satin-like finish in (F) of FIG. 3. Although the amount in which current can be reduced increases or decreases depending on the value of the current I2 and the period in which the current I1 flows, it can be reduced to less than ½ of that of the conventional art.

Accordingly, the total current flowing in the comparators 12, 13 is illustrated in (G) of FIG. 3. Compared to the conventional art, the current as illustrated with a satin-like finish can be significantly reduced.

<Circuit Configuration Diagram of Oscillation Circuit of Second Embodiment>

Figure 4:
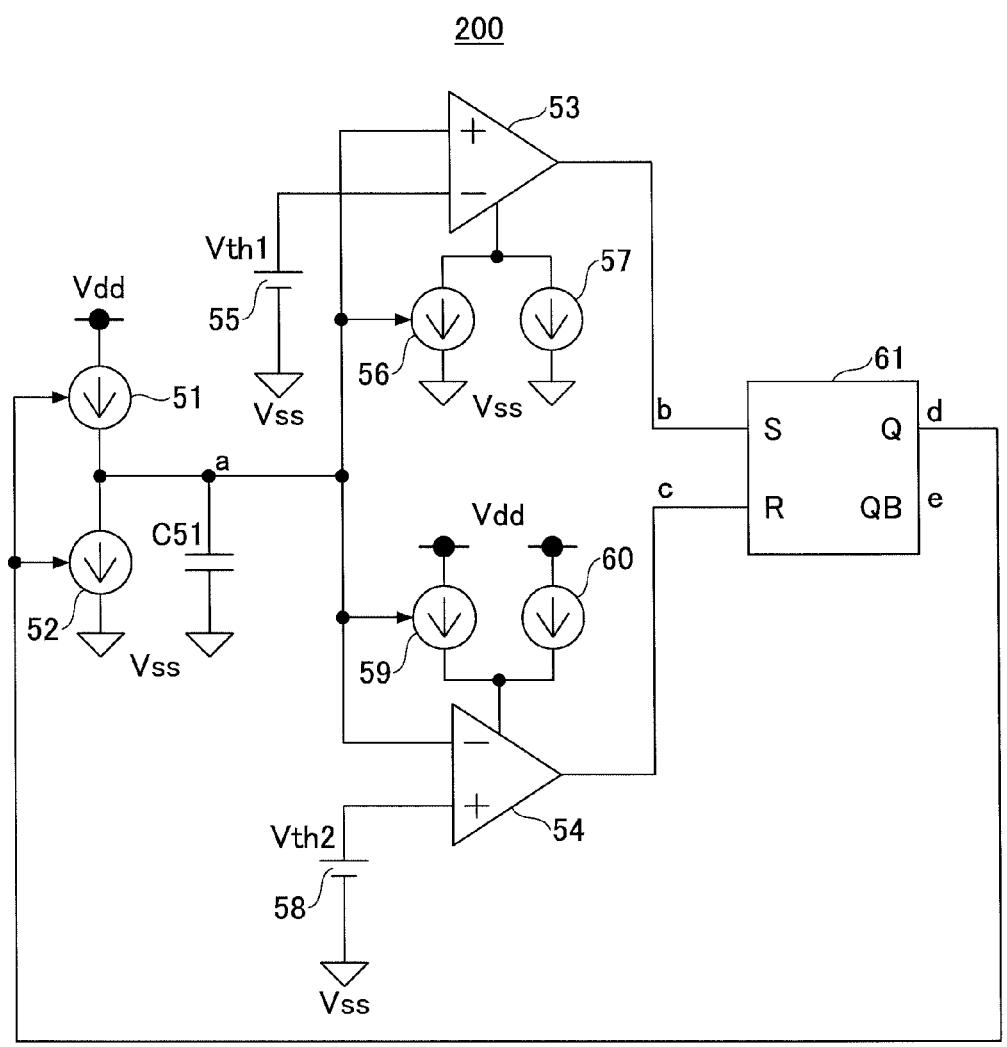
FIG. 4 is a circuit configuration diagram of an oscillation circuit according to a second embodiment of the present invention.

FIG. 4 is a circuit configuration diagram of an oscillation circuit 200 according to the second embodiment of the present invention. In FIG. 4, a constant current source 51 has one end connected to a power supply Vdd and another end connected to one end of a constant current source 52. The other end of the constant current source 52 is connected to a power supply Vss. The control terminals of the constant current sources 51, 52 are connected to a Q terminal of an RS flip-flop 61. The junction points of the constant current sources 51, 52 are connected to one end of a condenser C51 and also connected to a non-inverting input terminal of a comparator 53, a control terminal of a current source 56, an inverting input terminal of a comparator 54, and a control terminal of a current source 59. The other end of the condenser is connected to the power supply Vss.

The constant current source 51, which includes, for example, first and second p-channel MOS transistors connected vertically between the power supply Vdd and the one end of the constant current source 51, is configured to allow a constant current to flow by applying a bias voltage to a gate of the first p-channel MOS transistor, perform switching by applying the output of the Q terminal of the flip-flop 61 to a gate of the second MOS transistor, and allow a constant current to flow when the output of the Q terminal is a low level.

The constant current source 52, which includes, for example, third and fourth n-channel MOS transistors connected vertically between the one end of the condenser C51 and the power supply Vss, is configured to perform switching by applying the output of the Q terminal of the flip-flop 61 to a gate of the third MOS transistor, allow a constant current to flow by applying a bias voltage to a gate of the fourth p-channel MOS transistor, and allow a constant current to flow when the output of the Q terminal is a high level.

It is to be noted that the constant current sources 51, 52 may include an inverter to which the output of the Q terminal of the flip-flop 61 is supplied and a resistor having one end connected to an output terminal of the inverter and another end connected to the one end of the condenser C51. Other configuration may be used as long as the constant current sources 51, 52 can perform charging/discharging of the condenser C51.

The inverting input terminal of the comparator 53 is connected to one end of a constant voltage circuit 55 and is applied with a reference voltage Vth1. The other end of the constant voltage circuit 55 is connected to the power supply Vss. A non-inverting input terminal of the comparator 54 is connected to one end of a constant voltage circuit 58 and is applied with a reference voltage Vth2 (Vth1>Vth2). The other end of the constant voltage circuit 58 is connected to the power supply Vss.

The comparator 53 has a current input terminal connected to one end of the current source 56 and one end of the current source 57 and has an operating current supplied thereto. The other end of the current source 56 and the other end of the current source 57 are connected to the power supply Vss. The current source 56 has a control terminal to which a voltage of the condenser C51 is supplied. This voltage, when in the vicinity of the reference voltage Vth1, causes an operating voltage to flow to the comparator 53 in correspondence with the voltage of the condenser C51. The current source 57 allows a certain amount of operating current to constantly flow to the comparator 53. Here, an operating current, which flows from the current source 57 to the comparator 52, has a small value enough to allow the comparator 53 to maintain its internal state. The maximum amount of operating current, which flows from the current source 56 (when voltage is Vth1) to the current source 57 and the comparator 53, has a substantially large value enough to allow the comparator 53 to change its internal state.

The comparator 53 generates an output signal of a high level when a voltage of the condenser C51 exceeds a reference voltage Vth1 and generates an output signal of a low level when the voltage of the condenser C51 is less than or equal to the reference voltage Vth1, and supplies the output signal to a setting terminal S of the flip-flop 61.

The comparator 54 has a current input terminal connected to one end of a current source 59 and one end of a current source 60 and has an operating current supplied thereto. The other end of the current source 59 and the other end of the current source 60 are connected to the power supply Vdd. The current source 59 has a control terminal to which a voltage of the condenser C51 is supplied. This voltage, when in the vicinity of the reference voltage Vth2, causes an operating voltage to flow to the comparator 54 in correspondence with the voltage of the condenser C51.

The current source 60 allows a certain amount of operating current to constantly flow to the comparator 54. Here, an operating current, which flows from the current source 60 to the comparator 54, has a small value enough to allow the comparator 54 to maintain its internal state. The maximum amount of operating current, which flows from the current source 60 (when voltage is Vth2) to the current source 60 and the comparator 54, has a substantially large value enough to allow the comparator 54 to change its internal state.

The comparator 54 generates an output signal of a high level when a voltage of the condenser C51 exceeds the reference voltage Vth2 and generates an output signal of a low level when the voltage of the condenser C51 is greater than or equal to the reference voltage Vth2, and supplies the output signal to a resetting terminal R of the flip-flop 61.

A Q terminal output of the flip-flop 61 becomes a high level and a QB terminal output of the flip-flop 61 becomes a low level when a high level signal is supplied to the setting terminal S. Further, the Q terminal output of the flip-flop 61 becomes a low level and the QB terminal output of the flip-flop 61 becomes a high level when a high level signal is supplied to the resetting terminal R. One of or both of the outputs of the Q terminal or the QB terminal of the flip-flop 61 are output as an oscillation signal(s).

The configurations of the current sources 56, 57 are substantially the same as those of FIGS. 2A and 2B. Alternatively, the MOS transistor M21 may be omitted from the configuration of FIGS. 2A and 2B. In FIGS. 2A and 2B, the current sources 59, 60 may replace the MOS transistors M20-M22 with p-channel MOS transistors and be configured having the terminal 21 connected to the current input terminal of the comparator 54 and having the sources of the p-channel MOS transistors (corresponding to M21, M22) connected to the power source Vdd. Alternatively, the p-channel MOS transistor M21 may be omitted from the configuration of FIGS. 2A and 2B.

<Operation>

Figure 5:
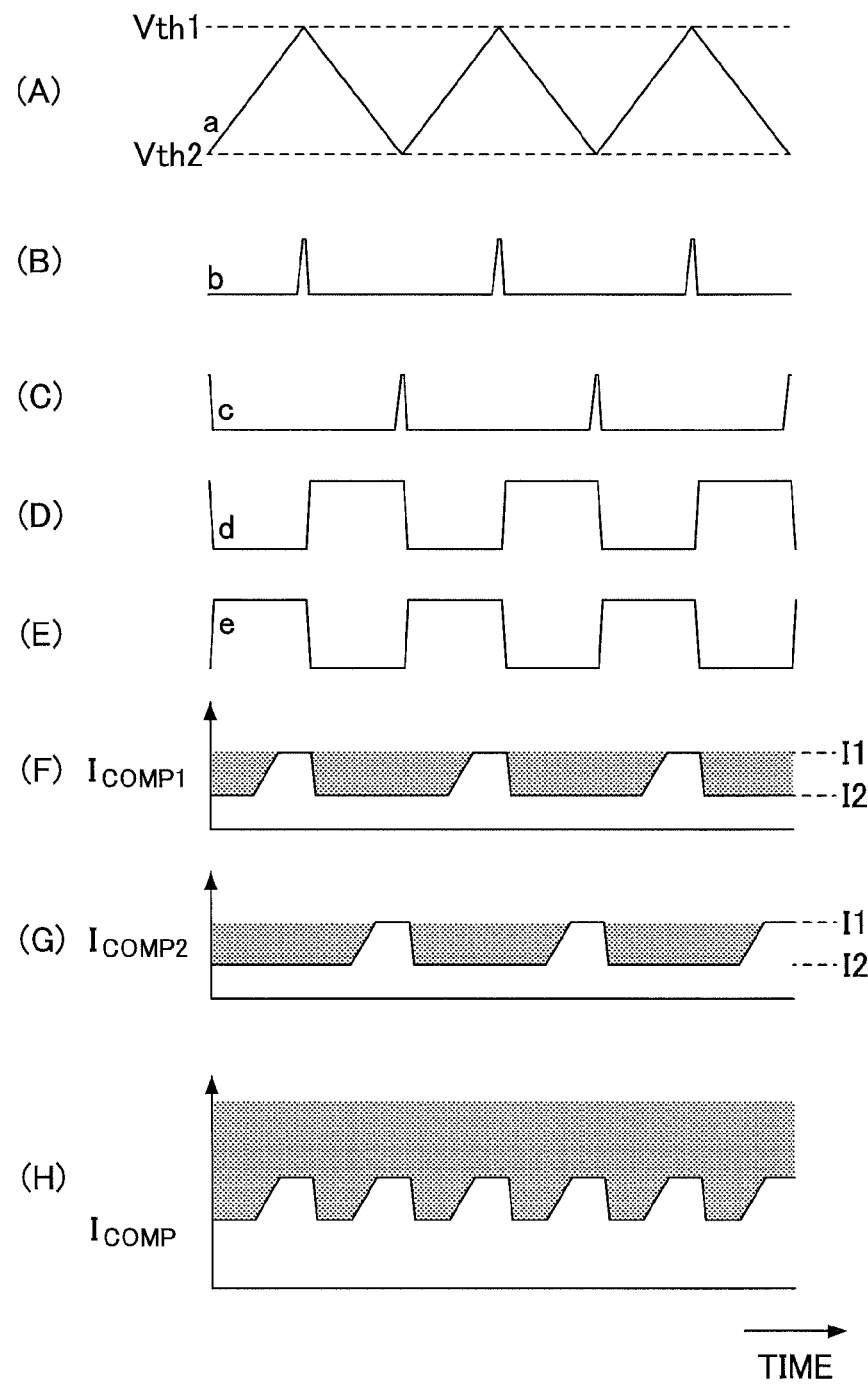
FIG. 5 is a signal waveform diagram of each part of the circuit of FIG. 4.

In a case where the output of the Q terminal of the flip-flop 61 is a low level ((D) of FIG. 5), the condenser C51 is charged by turning on the constant current source 51 and turning off the constant current source 52 ((A) of FIG. 5). Then, when the voltage of the condenser C51 exceeds the reference voltage Vth1, the output of the comparator 53 becomes a high level ((B) of FIG. 5). Thereby, the flip-flop 61 is set, so that the output of the Q terminal becomes a high level ((D) of FIG. 5) and the output of the QB terminal becomes a low level ((E) of FIG. 5).

In this case, the condenser C51 is discharged by turning off the constant current source 51 and turning on the constant current source 52. Then, when the voltage of the condenser C51 becomes less than the reference voltage Vth2, the output of the comparator 54 becomes a high level ((C) of FIG. 5). Thereby, the flip-flop 61 is reset, so that the output of the Q terminal becomes a low level and the output of the QB terminal becomes a high level.

The operating current of the comparator 53 is illustrated in (F) of FIG. 5. The current source 57 constantly supplies a current having a value I2, and the current source 56 supplies a serrated current having a maximum value I1 obtained by adding the voltage of the condenser C51 to the current I2 at the vicinity of the reference voltage Vth1. Although the comparator 53 requires a large current I1 when the output value switches between a low level and a high level, its inner state can be maintained as long as a small current I2 is supplied thereto when there is no switching.

Conventionally, a current having a value of I1 constantly flows to the comparator 2 whereas the above-described embodiment can reduce the amount of current corresponding to the part illustrated with a satin-like finish in (F) of FIG. 5. Although the amount in which current can be reduced increases or decreases depending on the value of the current I2 and the period in which the current I1 flows, it can be reduced to less than ½ of that of the conventional art.

Similarly, the operating current of the comparator 54 is illustrated in (G) of FIG. 5. The current source 60 constantly supplies a current having a value I2, and the current source 59 supplies a serrated current having a maximum value I1 obtained by adding the voltage of the condenser C51 to the current I2 at the vicinity of the reference voltage Vth2. Although the comparator 54 requires a large current I1 when the output value switches between a low level and a high level, its inner state can be maintained as long as a small current I2 is supplied thereto when there is no switching.

Accordingly, the total current flowing in the comparators 53, 54 is illustrated in (H) of FIG. 5. Compared to the conventional art, the current as illustrated with a satin-like finish can be significantly reduced.

<Circuit Configuration Diagram of Delta/Sigma Modulator>

Figure 6:
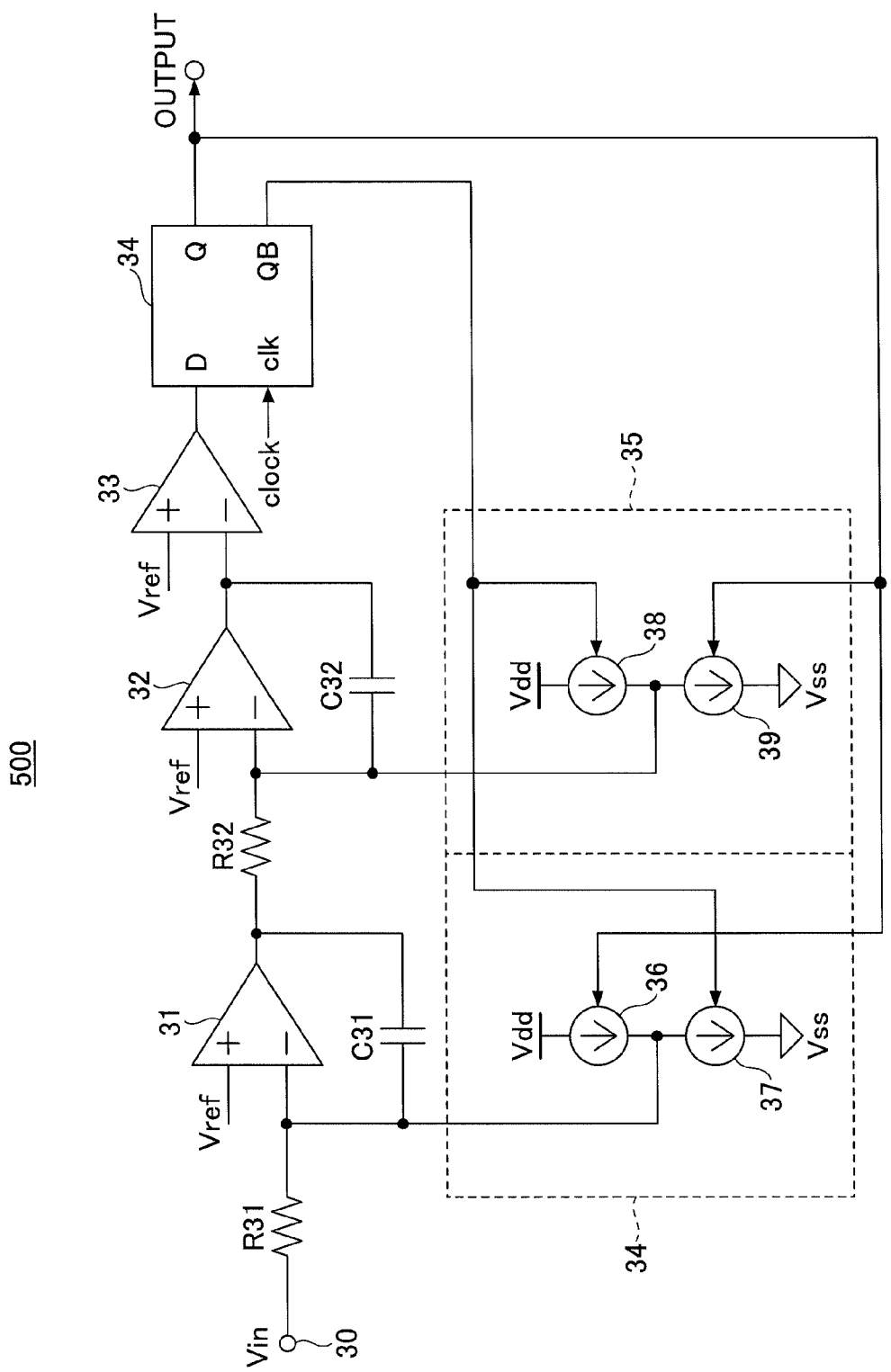
FIG. 6 is a circuit configuration diagram of an embodiment of a secondary continuous-time delta/sigma modulator that uses an oscillation signal.

FIG. 6 is a circuit configuration diagram of a secondary continuous-time delta/sigma modulator 500 that uses oscillation signals output from the oscillation circuits 100, 200 according to an embodiment of the present invention. In FIG. 6, an analog voltage Vin is supplied to a terminal 30, and further supplied to a primary integrating circuit including a resistor R31, a operational amplifier 31, and a feedback condenser C31. Further, the output of the operational amplifier 31 is supplied to a secondary integrating circuit including a resistor R32, a operational amplifier 32, and a feedback condenser C32. It is to be noted that a reference voltage Vref is supplied to the operational amplifiers 31, 32.

The output of the operational amplifier 32 is quantized by being compared with the reference voltage Vref in a comparator 33, and is supplied to a D-terminal of a D-type flip-flop 34. An oscillation signal generated in the oscillation circuit 100 of FIG. 1 or the oscillation circuit 200 of FIG. 4 is supplied as a clock to a clock terminal of the flip-flop 34. The flip-flop 34 delays the output of the comparator 33 for an amount equivalent to 1 clock and outputs it from the Q terminal, and also inverts the output of the Q terminal and outputs is from the QB terminal.

The output of the Q terminal of the flip-flop 34 is supplied to a control terminal of a constant current source 36 included in a 1 bit D/A converter 34 and control terminal of a constant current source 39 included in a 1 bit D/A converter 35. The output of the QB terminal of the flip-flop 34 is supplied to a control terminal of a constant current source 37 included in a 1 bit D/A converter 34 and a control terminal of a constant current source 38 included in a 1 bit D/A converter 35.

The D/A converter 34 has a configuration in which the other end of the constant current source 36 (having one end connected to the power supply Vdd) and the other end of the constant current source 37 (having one end connected to the power supply Vss) are connected. The constant current sources 36, 37 are turned on and supply current when a high level is supplied to its control terminals. The other end of the constant current source 36 and the other end of the constant current source 37 are connected to the inverting input terminal of the operational amplifier 31 to perform addition/subtraction of the input voltage (by way of the resistor R31) and the output voltage of the D/A converter 34. The voltage, after the performing of the addition/subtraction, is integrated in the primary integration circuit.

The D/A converter 35 has a configuration in which the other end of the constant current source 38 (having one end connected to the power supply Vdd) and the other end of the constant current source 39 (having one end connected to the power supply Vss) are connected. The constant current sources 38, 39 are turned on and supply current when a high level is supplied to its control terminals. The other end of the constant current source 38 and the other end of the constant current source 39 are connected to the inverting input terminal of the operational amplifier 32 to perform addition/subtraction of the input voltage (by way of the resistor R32) and the output voltage of the D/A converter 35. The voltage, after the performing of the addition/subtraction, is integrated in the secondary integration circuit. The delta/sigma modulator 500 performs pulse density modulation on an analog voltage Vin and outputs a signal being digitally modulated for 1 bit from the Q terminal of the flip-flop 34.

First Embodiment of D/A Converter

Figure 7:
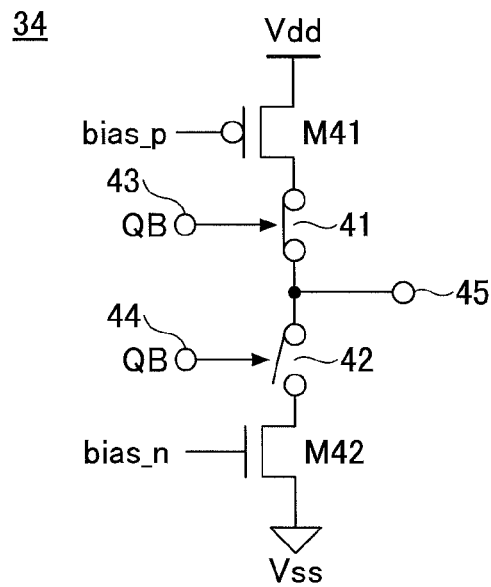
FIG. 7 is a circuit configuration diagram of a first embodiment of a D/A converter 34.

FIG. 7 is a circuit configuration diagram of the first embodiment of the D/A converter 34 (35). Due to having substantially the same configuration of as the D/A converter 34, the configuration of the first embodiment of the D/A converter 35 is not illustrated. In FIG. 7, a p-channel MOS transistor M41, a switch 41, a switch 42, and an n-channel MOS transistor M42 are vertically connected between the power supply Vdd and the power supply Vss. A constant current is allowed to flow by applying a bias voltage Vbias_p to a gate of the MOS transistor M41. A constant current is allowed to flow by applying a bias voltage Vbias_n to a gate of the MOS transistor M42.

The output of the Q terminal of the flip-flop 34 is supplied to a control terminal of the switch 41 by way of a terminal 43. The switch 41 is turned on when the terminal 43 is a high level. The output of the QB terminal of the flip-flop 34 is supplied to a control terminal of the switch 42 by way of a terminal 44. The switch 42 is turned on when the control terminal 44 is a high level. The junction points of the switches 41, 42 are connected from a terminal 45 to the inverting input terminal of the operational amplifier 31.

The switches 41, 42 are formed of, for example, MOS transistors. In this case, noise is generated in the current output from the terminal 45 from the parasitic capacitance between the gate and the source of the MOS transistor or the parasitic capacitance between the gate and drain of the MOS transistor during the switching of the switches 41, 42 and also generated in the bias voltages Vbias_p, Vbias_n. Further, because the current output from the terminal 45 fluctuates and is used for charging and discharging the above-described parasitic capacitances, the precision of the signal being digitally modulated for 1 bit and output from the Q terminal of the flip-flop 34 may become low.

Second Embodiment of D/A Converter

Figure 8:
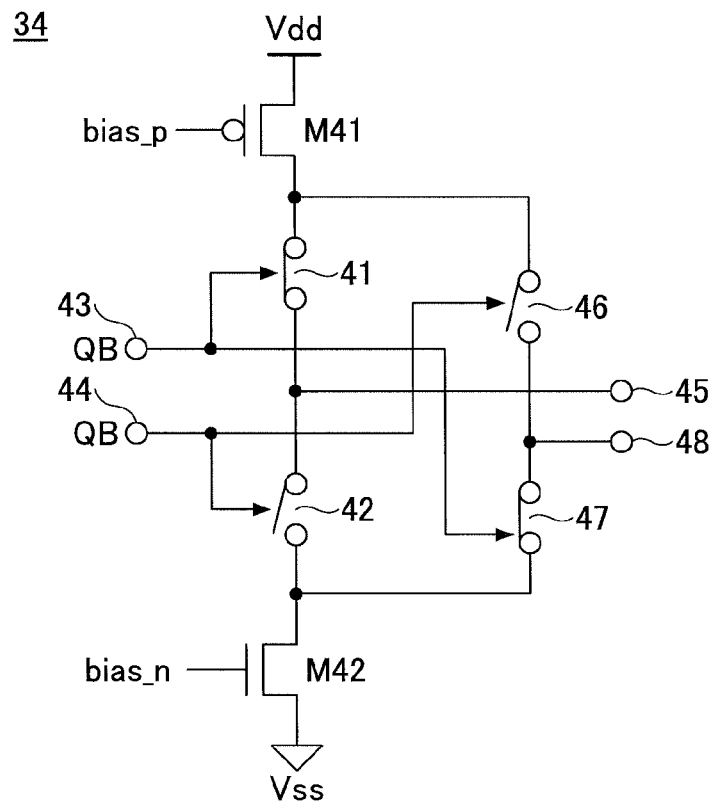
FIG. 8 is a circuit configuration diagram of a second embodiment of D/A converters 34, 35.
Figure 9:
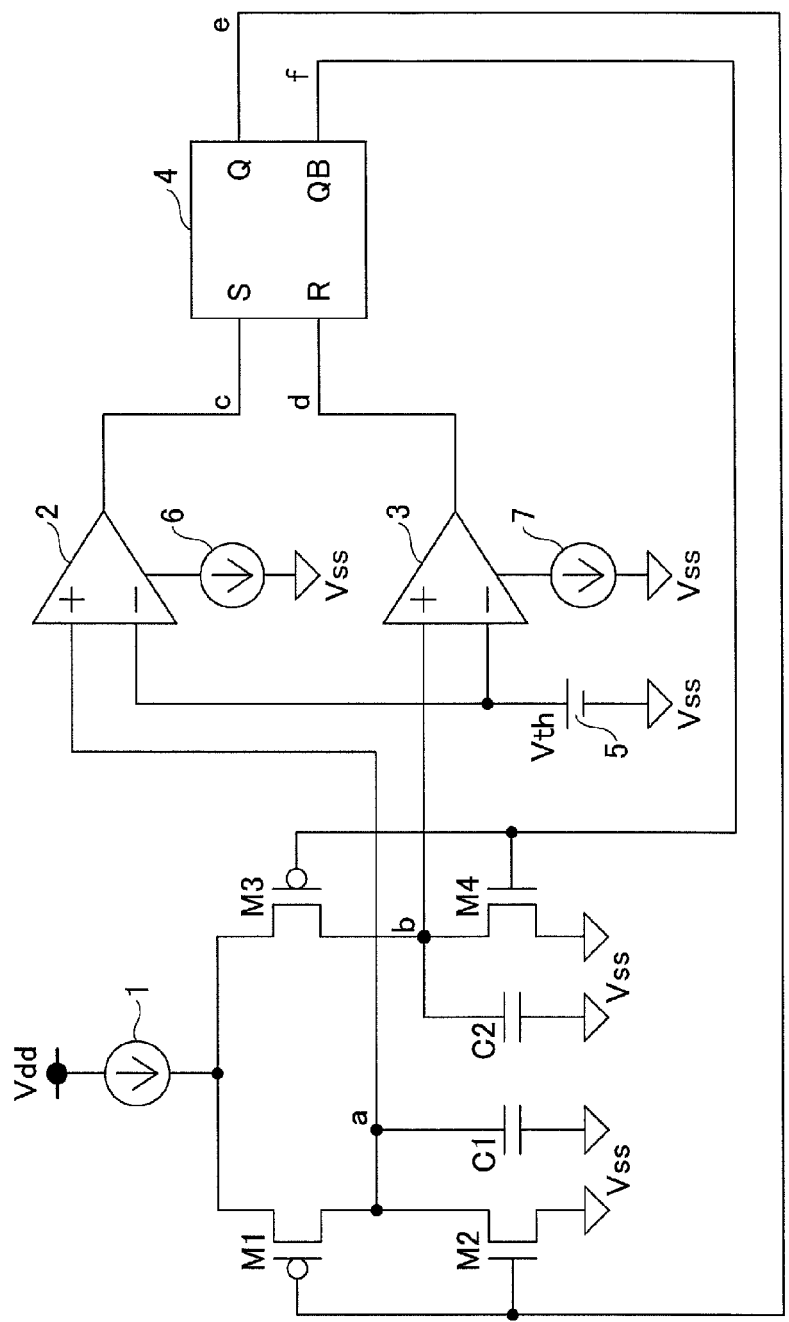
FIG. 9 is a circuit configuration diagram of an oscillation circuit according to a related art.
Figure 10:
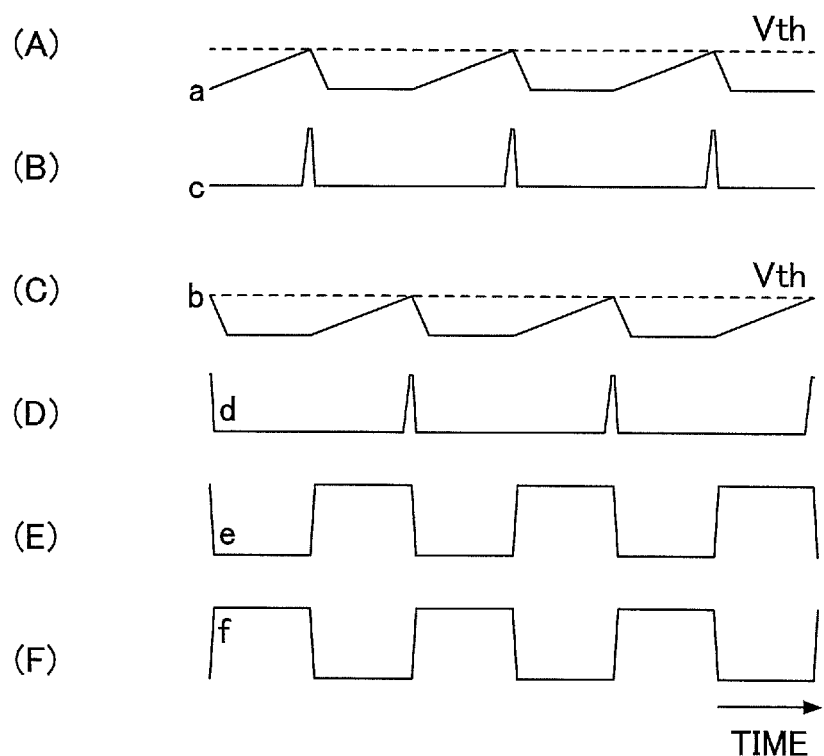
FIG. 10 is a signal waveform diagram of each part of the circuit of FIG. 9.

FIG. 8 is a circuit configuration diagram of the second embodiment of the D/A converter 34 (35). Due to having substantially the same configuration of as the D/A converter 34, the configuration of the second embodiment of the D/A converter 35 is not illustrated. In FIG. 7, a p-channel MOS transistor M41, a switch 41, a switch 42, and an n-channel MOS transistor M42 are vertically connected between the power supply Vdd and the power supply Vss. Further, the switches 41, 42 are connected in parallel with switches 46, 47 between the MOS transistor M41 and the MOS transistor M42.

A constant current is allowed to flow by applying a bias voltage Vbias_p to a gate of the MOS transistor M41, and a constant current is allowed to flow by applying a bias voltage Vbias_n to a gate of the MOS transistor M42. The output of the Q terminal of the flip-flop 34 is supplied to a control terminal of the switches 41, 47 by way of a terminal 43. The switches 41, 47 are turned on when the terminal 43 is a high level. The junction points of the switches 41, 42 are connected from a terminal 45 to the inverting input terminal of the operational amplifier 31. The output of the QB terminal of the flip-flop 34 is supplied to a control terminal of the switches 42, 46 by way of a terminal 44. The switches 42, 46 are turned on when the control terminal 44 is a high level. The junction points of the switches 46, 47 are connected from a terminal 48 to the inverting input terminal of the operational amplifier 32.

In this case, the switches 41, 47 are turned on when the terminal 43 is a high level whereas the switches 42, 46 are turned off because the terminal 44 is in a low level. Therefore, the current flowing from the drain of the MOS transistor M41 is output from the terminal 45 by way of the switch 41, and the current from the terminal 48 flows to the drain of the MOS transistor M42 by way of the switch 47.

Then, when the terminal 43 becomes a low level, the switches 41, 47 are turned off whereas the switches 42, 46 are turned on because the terminal 44 is in a high level. Therefore, the current flowing from the drain of the MOS transistor M41 is output from the terminal 48 by way of the switch 46, and the current from the terminal 45 flows to the drain of the MOS transistor M42 by way of the switch 42. In other words, the MOS transistor M41 performs the operations of the constant current source 36, 38, and the MOS transistor M42 performs operations of the constant current source 37, 39.

Further, because either the switch 41 or the switch 46 is turned on, the electric potential of the drain of the MOS transistor M41 becomes constant. Likewise, because either the switch 42 or the switch 47 is turned on, the electric potential of the drain of the MOS transistor M42 becomes constant. Thus, owing to the switching of the switches 41, 42, 46, 47, noise can be prevented from being generated in the current output from the terminals 45, 48 by the parasitic capacitance between the gate and the source or the parasitic capacitance between the gate and the drain of the MOS transistors included in the switches 41, 42, 46, 47.

Further, when the noise from the terminal 43 reaches the drain of the MOS transistor M41 by way of the parasitic capacitance between the gate and the source of the MOS transistor included in the switch 41, the noise is output from the terminal 44 by way of the parasitic capacitance between the gate and the source of the MOS transistor included in the switch 46. Thereby, the influence of the noise can be reduced. Likewise, when the noise from the terminal 44 reaches the drain of the MOS transistor M42 by way of the parasitic capacitance between the gate and the source of the MOS transistor included in the switch 42, the noise is output from the terminal 43 by way of the parasitic capacitance between the gate and the source of the MOS transistor included in the switch 47. Thereby, the influence of the noise can be reduced.

For example, in the above-described embodiments, the MOS transistors M11-M14 or the constant current sources 51, 52 function as a charging/discharging part, and the current sources 16-19 or 56, 57 function as a current control part.

Further, the present invention is not limited to these embodiments, but various variations and modifications may be made without departing from the scope of the present invention.

The present application is based on Japanese Priority Application No. 2010-138231 filed on Jun. 17, 2010, with the Japanese Patent Office, the entire contents of which are hereby incorporated by reference.

The invention claimed is:

1. An oscillation circuit comprising:
a condenser;
a charging/discharging part configured to switch between charging and discharging of the condenser according to a control signal;
a comparator configured to compare a voltage of the condenser with a reference voltage and output a comparison result signal;
a flip-flop configured to be set or reset according to the comparison result signal, supply an output signal as the control signal to the charging/discharging part, and output the output signal as an oscillation signal; and
a current control part including a current source configured to control an operating current of the comparator with the voltage received from the condenser,
wherein the voltage of the condenser is provided directly to the current source.

2. The oscillation circuit as claimed in claim 1, wherein the current control part includes
a first current control part configured to flow a current corresponding to the voltage of the condenser to the comparator where the voltage of the condenser is in a vicinity of a reference voltage of the comparator, and
a second current control part configured to constantly flow a certain amount of operating current to the comparator.

3. The oscillation circuit as claimed in claim 1, further comprising:
a level changing part configured to change the comparison result signal of the comparator to a predetermined level based on a signal delayed relative to the output signal of the flip-flop.

4. A method for controlling an operating current of an oscillation circuit including at least a condenser, a charging/discharging part, a comparator, and a flip-flop, the method comprising:
- switching between charging and discharging of the condenser according to a control signal by the charging/discharging part;
- comparing a voltage of the condenser with a reference voltage and outputting a comparison result signal by the comparator;
- setting or resetting the flip-flop according to the comparison result signal, supplying an output signal of the flip-flop as the control signal to the charging/discharging part, and outputting the output signal as an oscillation signal;
- controlling an operating current of the comparator with a current source using the voltage received from the condenser; and
- providing the voltage of the condenser directly to the current source.

5. The method as claimed in claim 4, further comprising:
changing the comparison result signal of the comparator to a predetermined level based on a signal delayed relative to the output signal of the flip-flop.

6. An oscillation circuit comprising:
- a condenser;
- a charging/discharging part configured to switch between charging and discharging of the condenser according to a control signal;
- a comparator configured to compare a charged/discharged analog voltage of the condenser with a reference voltage and output a comparison result signal;
- a flip-flop configured to be set or reset according to the comparison result signal, supply an output signal as the control signal to the charging/discharging part, and output the output signal as an oscillation signal; and
- a current control part including a current source having an input that receives the charged/discharged analog voltage from the condenser, the current source being configured to control an operating current of the comparator with the charged/discharged analog voltage received from the condenser.

7. The oscillation circuit as claimed in claim 6, wherein the current control part includes
- a first current control part configured to flow a current corresponding to the charged/discharged analog voltage of the condenser to the comparator where the charged/discharged analog voltage of the condenser is in a vicinity of a reference voltage of the comparator, and
- a second current control part configured to constantly flow a certain amount of operating current to the comparator.

8. The oscillation circuit as claimed in claim 6, further comprising:
- a level changing part configured to change the comparison result signal of the comparator to a predetermined level based on a signal delayed relative to the output signal of the flip-flop.

* * * * *